US006294726B1

(12) United States Patent
Hässler et al.

(10) Patent No.: US 6,294,726 B1
(45) Date of Patent: Sep. 25, 2001

(54) SILICON WITH STRUCTURED OXYGEN DOPING, ITS PRODUCTION AND USE

(75) Inventors: Christian Hässler; Hans-Ulrich Höfs; Wolfgang Koch, all of Krefeld; Siegfried Thurm, Meerbusch; Otwin Breitenstein, Langenbogen, all of (DE)

(73) Assignee: Bayer Aktiengesellschaft (DE)

( * ) Notice: Subject to any disclaimer, the term of this patent is extended or adjusted under 35 U.S.C. 154(b) by 0 days.

(21) Appl. No.: 09/591,518

(22) Filed: Jun. 9, 2000

(30) Foreign Application Priority Data

Jun. 17, 1999 (DE) .............................................. 199 27 604

(51) Int. Cl.$^7$ .................................................... H01L 31/00
(52) U.S. Cl. .......................... 136/258; 136/261; 257/461; 257/463; 257/66; 257/75; 117/20; 117/23; 117/73; 117/74; 438/97; 438/89
(58) Field of Search ...................... 136/258 AM, 258 PC, 136/261; 257/461, 463, 66, 75; 117/20, 23, 73, 74; 423/348, 325; 438/96, 97, 89

(56) References Cited

U.S. PATENT DOCUMENTS

| 4,670,096 | 6/1987 | Schwirtlich et al. . |
| 5,106,763 | 4/1992 | Bathey et al. . |
| 5,156,978 | 10/1992 | Bathey et al. . |
| 5,298,109 | 3/1994 | Knauth et al. . |
| 5,490,477 | 2/1996 | Knauth et al. . |
| 5,492,079 | 2/1996 | Geissler et al. ........................ 117/30 |

FOREIGN PATENT DOCUMENTS 63837  11/1982  (EP) .

OTHER PUBLICATIONS

Yonenaga et al, "Role of Carbon in the Strengthening of Silicon Crystals," Japanese Journal of Applied Physics, vol. 23, No. 8, part 2, pp. L590–L592, Aug. 1984.*

Kawado et al, "Crystal Perfection of Silicon Single Crystals Grown by the Magnetic–Field–Applied Czochralski Method," Journal of the Electrochemistry Society vol. 133, pp. 171–174, Jan. 1986.*

J. Appl. Phys. 77(11), Jun. 1995, Vanhellemont et al, pp. 5669–5676, Impact of Oxygen Related Extended Defects on Silicon Diode Characteristics.

Japanese Journal of Applied Physics, vol. 23, Nr. 8, Aug. 1984, pp. L590–L592, Japanese Journal of Applied Physics, Tokyo, JP, ISSN: 0021–4922, Yonenaga et al "Role of Carbon in the Strengthening of Silicon Crystals".

Journal of the Electrochemical Society, vol. 133, Nr. 1, Jan., 1986, pp. 171–174, Electrochemical Society, Manchester, New Hampshire, US ISSN: 0013–4651, Kawado et al, "Crystal Perfection of Silicon Single Crystals Grown by the Magnetic Field Applied Czochralski Method".

Journal of the Electrochemical Society, US, Electrochemical Society, Manchester, NH, vol. 141, Nr. 12, Dec. 1, 1994, pp. 3588–3593, ISSN: 0013–4651, Sueoka et al, "Morphology Change of Oxide Percipitates in cz Silicon During Two–Step Annealing".

Journal of Crystal Growth, NL, North–Holland Publishing Co. Amsterdam, vol. 177, Nr. 1–2, May 1, 1997, pp. 41–51, XP004083901, ISSN: 0022–0248, Morelhao et al "An X–ray Topography Study of the Dendritic Web Silicon Growth Process".

* cited by examiner

*Primary Examiner*—Alan Diamond
(74) *Attorney, Agent, or Firm*—Connolly Bove Lodge & Hutz LLP

(57) ABSTRACT

The present invention relates to silicon with a high oxygen content and, at the same time, a high density of crystal lattice dislocations, and to its production. This silicon may be used in photovoltaics. Solar cells which are based on the material according to the invention exhibit high levels of efficiency despite the high oxygen content.

16 Claims, No Drawings

SILICON WITH STRUCTURED OXYGEN DOPING, ITS PRODUCTION AND USE

BACKGROUND OF THE INVENTION

The present invention relates to silicon with a high oxygen content and a high dislocation density, to its production and to its use for the production of solar cells.

Crystalline silicon is the material from which the vast majority of all solar cells for photovoltaic conversion of sunlight into electrical energy are currently manufactured. Monocrystalline and polycrystalline silicon form the two principle variants of the silicon material used for solar cells. While monocrystalline silicon is usually pulled as a single crystal from a silicon melt using the Czochralski process, there are a number of production processes for polycrystalline silicon. The most usual processes are various block-crystallization processes in which the silicon wafers for producing the solar cells are obtained by sawing a solid polycrystalline silicon block, and various film-drawing processes or film-casting processes, in which the wafers are drawn or cast in their final thickness as a silicon film from a molten material. Examples of the film-drawing process are the EFG process (Edge-defined Film-fed Growth) (EP 0,369,574 A2) and the RGS (Ribbon Growth on Substrate) process (EP 0,165,449 A1, DE 4,102,484 A1, DE 4,105,910 A1).

Solar cells are large-area pn diodes, in the volume of which the sunlight generates minority charge carriers which have to diffuse towards the emitter at the surface of the cell, so that they can there be separated at the pn-junction by the electric field and contribute to the external current flow. The greater the service life and therefore also the diffusion length of the minority charge carriers in the base, the more effective this process. Consequently, particular demands are imposed on the quality of the silicon material for producing solar cells: this material must be as far as possible free of impurities and crystal defects, in order to enable a maximum diffusion length of the minority charge carriers to be achieved.

Oxygen is usually the dominant impurity in silicon, since the silicon melt is usually melted in a quartz crucible ($SiO_2$). Although oxygen is electrically inactive as an interstitially dissolved impurity, it is known that if there is an oxygen content of above approximately $8 \times 10^{17}$ atoms/cm$^3$ in the silicon material caused by high-temperature steps, the minority carrier service life is also reduced (J. Vanhellemont et al., J. Appl. Phys. 77 (11), 5669 (1995)), and therefore so is the efficiency of solar cells. Therefore, the rule has hitherto been that silicon material with an oxygen content of over $8 \times 10^{17}$ atoms/cm$^3$ is unsuitable for the production of solar cells.

Especially for highly productive film-drawing or film-casting processes, it is particularly difficult and expensive to produce a silicon material with a sufficiently low oxygen content. Particularly in the case of the RGS material, it is necessary to apply a stream of oxidizing gas to the solidifying surface in order to establish a sufficiently smooth surface (DE 4,105,910 A1). Consequently, a relative high oxygen concentration is established in the volume of the RGS material. In the layer of silicon which is close to the surface, the oxygen content is even greater, and in fact the surface of untreated specimens is even to a large extent covered with a layer of silicon dioxide. This is necessary and desirable in order to immobilize impurities which have segregated out. In the case of thin silicon films such as an RGS film having a thickness of around 300 μm, without the getting action of the oxygen close to the surface, the metallic impurities which have just been concentrated in this thin zone would immediately diffuse back into the interior of the film, which is still at a temperature of over 1000° C.

In view of the foregoing, the invention is based on the object of preparing silicon which, despite having a high oxygen concentration, is suitable for use in photovoltaics. Advantageously, this allows solar cells which contain this silicon to reach levels of efficiency which enable them to be used economically.

Surprisingly, it has now been discovered that silicon with a high oxygen concentration can be used in photovoltaics if it additionally has a high density of crystal lattice dislocations (referred to below as dislocations). This is even more surprising since a high dislocation density generally leads to materials which are relatively unsuitable for photovoltaics.

DESCRIPTION OF THE INVENTION

Consequently, the invention relates to silicon which has a total oxygen content of from $8 \times 10^{17}$ atoms/cm$^3$ to $1 \times 10^{19}$ atoms/cm$^3$ and a dislocation density of $1 \times 10^5$ cm$^{-2}$ to $5 \times 10^7$ cm$^{-2}$. The dislocation density is preferably from $5 \times 10^5$ cm$^{-2}$ to $5 \times 10^6$ cm$^{-2}$. The invention furthermore relates to a process for producing silicon with a total oxygen content of $8 \times 10^{17}$ atoms/cm$^3$ to $1 \times 10^{19}$ atoms/cm$^3$ and a dislocation density of $1 \times 10^5$ cm$^{-2}$ to $5 \times 10^7$ cm$^{-2}$ and to solar cells which contain this silicon. These and other features, aspects, and advantages of the present invention will become better understood with reference to the following description and appended claims.

The silicon according to the invention can be produced at a low cost using highly productive processes such as film-casting or film-drawing processes, and can be used to good effect in photovoltaics. Solar cells which contain the silicon according to the invention in some instances have a higher short-circuit current than an identically processed solar cell which is based on monocrystalline Czochralski silicon, which is a particularly high-quality material for photovoltaics.

Obtaining a high oxygen content in the silicon generally involves the step of substantially saturating with oxygen a molten silicon that is in contact with silicon monoxide and/or silicon dioxide, and/or treating the molten silicon with an oxygen-containing gas before or during the crystallization. The high oxygen content in the silicon according to the invention may, for example, be achieved by applying an oxygen-containing gas or gas mixture to liquid silicon during the crystallization process. Advantageously, the gas mixture used consists of an inert gas component and a reactive gas component. An inert gas which may be used is argon, while a reactive gas component which may be used is oxygen. The high oxygen content may also be established, for example, by the controlled use of quartz ($SiO_2$) crucibles and internals with a high ratio of the surface area of these quartz components which is wetted by liquid silicon during the production of the silicon material to the volume of the liquid silicon. A combination of a plurality of methods is advantageous. A high oxygen content can be achieved in a particularly advantageous manner if the silicon is produced using the RGS process as described, for example, in DE 4105910 A1, and in the process is exposed to a gas mixture which contains at least 50% by volume oxygen.

The dislocation density is set by means of the crystallization rate during the production of the silicon. High crystallization rates usually lead to high crystal defect and therefore dislocation densities. For its part, the crystallization rate is set by means of the temperature profile during the crystallization process of liquid silicon. Rapid cooling of liquid silicon causes a high crystallization rate and therefore a high dislocation density. Rapid cooling of the silicon which has just been crystallized is generally associated with steep temperature gradients; these lead to mechanical stresses which in turn bring about the formation of further dislocations.

According to the invention, by setting a suitable temperature profile it is also possible to influence the form in which the oxygen is present in the silicon. For using the silicon in photovoltaics, it is advantageous if at least 25%, preferably at least 50%, particularly preferably at least 75% of the total oxygen present is in the form of silicon/oxygen precipitations, while the remaining oxygen is dispersed as interstitial (dissolved) oxygen in the silicon. This is achieved, for example, by heating at a temperature of 500° C. to 1250° C., preferably from 800° C. to 1150° C., for a period of one minute to ten hours, preferably from 15 minutes to two hours, although the temperature must exceed 950° C. for at least one minute. Within the range indicated, the temperature may be kept constant or varied. The silicon is then allowed to cool to room temperature.

The dissolved (interstitial) oxygen content is measured by FTIR (Fourier-transform infrared spectroscopy) in accordance with DIN 50 438 Part 1. If deviations from this standard (for example the specimen thickness) cannot be avoided, measurement is carried out based as closely as possible on the abovementioned standard. For this purpose, the silicon is quenched from T>1250° C. to T<500° C. within less than 2 min immediately after crystallization, or if this is not possible or appropriate, the silicon in question, for measurement purposes is initially heated at a temperature of greater than 1250° C. for longer than 1 h and is then quenched to a temperature of less than 500° C. within less than 2 min.

The dislocation density is measured using the method described below. The silicon material specimens are initially adhesively bonded to a PVC specimen holder using a two-component adhesive and, after the adhesive has set, are surface-ground using 400 silicon carbide abrasive paper (Struers) and rinsed. This is followed, in steps, by precision-grinding with 800, 1000 and 2400 paper and rinsing, each grinding operation lasting about one minute. The washing and rinsing liquid used is demineralized water. Then, the specimens are lapped with diamond liquid (3 $\mu$m) (Struers) on the appropriate textile cloth. The finish polishing operation takes place on a textile cloth, and 45% strength silica sol produced by BAYER AG (tradename Levasil 100®) is used. Polishing is carried out until the surface appears smooth on visual inspection (30 min to 1 h).

Then, the specimen is thoroughly rinsed, followed by treatment with an etching solution which acts selectively on crystal defects. The specimen is etched for one minute in a freshly prepared solution of potassium dichromate and hydrofluoric acid, with constant vigorous stirring. The etching solution consists of 40 ml of a 45% strength aqueous potassium dichromate solution and 60 ml of 40% strength hydrofluoric acid. The etching treatment causes small funnels, so-called etch pits, which are subsequently counted by image analysis, at the locations at which dislocation lines extend through the surface.

For this analysis, the specimen surface is viewed under a light-optical microscope in the dark field with 500 times magnification. Via a CCD camera, the image is fed to an image-processing system, in which the image is digitized in 768×512 pixels and is stored. With the selected dark-field illumination, the grain boundaries and etch pits show up as light areas. All light objects covering between 5 and 500 pixels and with an ellipse factor of greater than 0.3 (ratio of the long ellipse axis to the short ellipse axis) are interpreted as dislocation etch pits and are counted, grain boundaries being excluded from the count.

The silicon according to the invention can be obtained using standard methods which are employed to produce base material for solar cells, provided that the high oxygen content and the high dislocation density can be set using the measures described above. Film-drawing and film-casting methods are advantageously used, and preferably the silicon according to the invention is produced using the RGS process.

The silicon according to the invention can be used to good effect in photovoltaics. It can be p- or n-doped using the standard methods known to the person skilled in the art. The doped silicon can be used in a known way as a starting material for solar cells.

The doping of the silicon takes place, for example, during its crystallization. p-doped silicon is obtained, for example, by adding boron compounds or preferably adding a boron-silicon source alloy to the molten silicon or to the silicon which is to be melted. n-doped silicon is obtained, for example, by adding phosphorus compounds or preferably by adding a phosphorus-silicon source alloy to the molten silicon or to the silicon which is to be melted. n- or p-doped silicon may also be obtained by means of a suitable composition of silicon raw materials or secondary silicon raw materials which contain the desired total doping quantity of, for example, boron or phosphorus.

From the p-doped silicon with the high oxygen content according to the invention and the high dislocation density, it is possible, for example, to produce $n^+p$ solar cells, and the n-doped silicon is suitable as a starting material for $p^+n$ solar cells. Ways of processing solar cells from doped silicon form part of the prior art and are known to the person skilled in the art.

The silicon according to the invention, despite its high oxygen content, is an eminently suitable starting material for solar cells. The high dislocation density in the silicon plays a particular role in this respect. If there is a high oxygen concentration and a high dislocation density in the silicon material, the oxygen precipitates out in the form of silicon/oxygen aggregates or clusters, preferably at the location of the dislocations, while high-temperature steps are being carried out (before or during processing of the solar cell). Consequently, the oxygen precipitations are not, as is otherwise usual, in the form of isolated particles, but rather are arranged as chains along the dislocations. If the oxygen content is sufficiently high and enough oxygen has precipitated out, these precipitation chains are positively charged by the oxygen charges which are usually frozen in the oxide and form positively charged filaments with a diameter of preferably between 1 and 100 $\mu$m. These charged precipitate filaments have different effects depending on whether the solar cell, as is generally customary, is manufactured from p-conducting starting material ($n^+p$ structure) or from n-conducting starting material ($p^+n$ structure).

With an $n^+p$ structure, most of the precipitate filaments are located in the p-conducting material of the base of the cell. If the oxide charge is sufficiently great, the immediate surroundings of the filaments undergo a charge carrier inversion, i.e., the surroundings of the filaments become n-conducting. Consequently, their recombination activity for electrons is reduced substantially, since there are no longer any holes as recombination partners, as is the case in the known spontaneous surface inversion under an oxidized p-silicon surface. Likewise in the same way, the precipitate filaments act as conductors for minority charge carriers (in this case electrons) through the crystal. Since a considerable number of the filaments project through the pn-junction and are consequently electrically connected to the emitter, minority charge carriers can flow out of the depth of the base to the pn-junction at the surface via the filaments, with the result that the current efficiency of the solar cell is improved significantly. Therefore, the effect of using the material according to the invention for producing n$^+$p solar cells is that the precipitation filaments which form during the processing form a system of conductive channels (n-conducting or electron-conducting channels) which are electrically connected to the emitter and consequently transport the minority carriers particularly effectively out of the base to the emitter. Consequently, it is already possible for the solar cell to function with a minority charge carrier diffusion length which is short compared to the wafer thickness.

If solar cells are produced from n-conducting starting material with a p-doped emitter (p$^+$n structure), the positively charged oxygen precipitations formed during the processing through the use of the material according to the invention act as follows: they have an electrostatically repelling action on the light-generated minority charge carriers (in this case holes), but attract majority charge carriers (electrons). Therefore, enhancement channels which repel the minority charge carriers are formed around the filaments. This is the same effect as that achieved with conventional n$^+$p solar cells by means of an additional p$^+$ doping of the back surface contact and known as "Back Surface Field, BSF". In this case too, the back surface of the cell is passivated by a repelling electric field and is therefore made recombination-inactive. The use of the silicon according to the invention to produce p$^+$n solar cells therefore leads to the dislocations and also other crystal defects being effectively passivated by the positively charged silicon/oxygen precipitations which are formed during the processing, resulting in a sufficiently great diffusion length for the charge carriers in the silicon despite the high defect density.

The advantage of using the silicon according to the invention for manufacturing solar cells compared to the silicon material which has hitherto been used for solar cells is that this silicon can be produced at particularly low cost, since there is no need to observe a maximum permissible oxygen content during its production. It is easier to fuse oxygen-rich silicon material than oxygen-depleted silicon material. A further advantage is that the material may have a higher density of crystal defects, since in the case of the p-doped silicon these defects are deliberately used for current conduction, and in the case of n-doped silicon the defects are effectively passivated.

The production of the silicon according to the invention, its use in photovoltaics and the production and properties of solar cells which are based on this silicon are explained in more detail with reference to the following examples. However, the examples do not constitute any limitation of the inventive concept, but rather merely illustrate this concept.

EXAMPLES

The following text describes the production of p- and n-conducting silicon films using the RGS process (Ribbon Growth on Substrate) in accordance with EP 0 165 449 A1 and DE 41 05 910 A1 as exemplary embodiments for the production of the silicon material according to the invention for the production of solar cells.

Example 1

300 g of silicon granules were melted in a quartz glass crucible together with 1.2856 g of a boron-silicon source alloy containing 43 ppmg boron and were then poured into the mould of a discontinuously operating RGS installation. Then, the graphite substrate plates of the RGS installation were moved along beneath the casting frame at a speed of 6.5 m/min. This was accompanied by a gas flow of 7.5 m$^3$/h, consisting of 67% by volume oxygen and 33% by volume argon, being passed behind the mould over the surface of the solidifying silicon. The resultant silicon films were initially held at approx. 1130° C. for 1 h by means of compensation heating, and was then cooled to approx. 990° C. by suitably lowering the heating at approx. −50° C./h, and finally were cooled to room temperature within around 2 h by switching off the heating.

FTIR spectroscopy revealed an interstitial oxygen content of 1.4×10$^{17}$ atoms/cm$^3$ in the silicon films. Silicon films which were produced in a similar way but were cooled to 500° C. within 20 seconds and then to room temperature within 1 h, without the heat treatment described above, exhibited a corresponding interstitial oxygen content of 2.6×10$^{18}$ atoms/cm$^3$.

Example 2

The procedure was as in Example 1, except that 300 g of secondary silicon raw material from the semiconductor industry with a phosphorus doping corresponding to a resistance of 1 Ωcm were used.

FTIR spectroscopy revealed an interstitial oxygen content of 4.0×10$^{17}$ atoms/cm$^3$ in the silicon films. Silicon films which were produced in a similar way but were cooled to 500° C. within 20 sec and then to room temperature within 1 h, without the heat treatment described above, exhibited a corresponding interstitial oxygen content of 2.2×10$^{18}$ atoms/cm$^3$.

The following text describes the production of an n$^+$p solar cell and a p$^+$n solar cell from p- and n-conducting starting materials, respectively, as exemplary embodiments for the use of the silicon material according to the invention for the production of solar cells.

Example 3 n$^+$p solar cells made from the silicon according to the invention were built up a number of times with a size of 2×2 cm$^2$ as laboratory specimens. The p-conducting starting material had a boron doping of 10$^{16}$ atoms/cm$^3$, a thickness of 350 μm and, according to the invention, had an oxygen content of 3.2×10$^{18}$ atoms/cm$^3$ and a mean dislocation density of approximately 5×10$^5$ cm$^{-2}$. The emitter was diffused in conventionally using a phosphorus diffusion step at 825° C. for 1 h in an oxidizing environment. A back surface contact was applied by vapour deposition of the following layer assembly: 0.2 μm Al, 0.2 μm Ti, 0.02 μm Pd and 2 μm Ag. Then, the silicon wafer which had been pretreated in this way underwent heat treatment for 30 min at 625° C. in a nitrogen-hydrogen atmosphere, in order to produce a good ohmic contact. A front surface contact grid was produced by vapour deposition of the following layer assembly: 0.2 μm Ti, 0.02 μm Pd, 2 μm Ag. There was no ant-reflection coating. After the processing, the dislocations in the base material of the cell were converted to precipitation filaments with a diameter of the order of magnitude of 10 nm, as shown by transmission electron microscopy. At 18.55 mA/cm$^2$, the short-circuit current of the solar cells was amazingly high for a material with this density of defects, a fact which can be explained without problems due to the inventive formation of the inverting conductive channels (n-conducting channels) around the precipitation filaments. The short-circuit current of a wafer made from monocrystalline Czochralski Si, which is a particularly high-grade material for photovoltaics, processed using the same procedure was only 18.21 mA/cm$^2$.

Example 4 p$^+$n-n$^+$ solar cells were obtained from n-conducting silicon. The n-conducting starting material had a phosphorus doping of $10^{16}$ atoms/cm$^3$ and, according to the invention, an oxygen content of $3.2 \times 10^{18}$ atoms/cm$^3$ and a mean dislocation density of approximately $5 \times 10^5$ cm$^{-2}$. The p-doped emitter was produced by diffusing in aluminium, and a back surface field (BSF) was produced on the back surface by phosphorus diffusion. The back surface contact consisted, for example, of a layer system comprising 0.2 $\mu$m Ti, 0.02 $\mu$m Pd, 2 $\mu$m Ag, and the front surface contact grid was produced by applying an Al layer. The use according to the invention of very oxygen-rich starting material resulted in the crystal defects in the base being passivated, so that they did not contribute, or scarcely contributed, to shortening the diffusion length of the material.

As an alternative, the emitter may, for example, also be produced by diffusing in boron.

Although the invention has been described in detail in the foregoing for the purpose of illustration, it is to be understood that such detail is solely for that purpose and that variations can be made therein by those skilled in the art without departing from the spirit and scope of the invention except as it may be limited by the claims.

What is claimed is:

1. A silicon composition comprising a total oxygen content of $8 \times 10^{17}$ atoms/cm$^3$ to $1 \times 10^{19}$ atoms/cm$^3$ and a dislocation density of $1 \times 10^5$ cm$^{-2}$ to $5 \times 10$ cm$^{-2}$, and wherein the silicon is polycrystalline.

2. The silicon composition of claim 1, wherein at least 25% of the oxygen contained therein is in the form of silicon/oxygen precipitations.

3. The silicon composition of claim 2, wherein the silicon/oxygen precipitations are concentrated in the area of grain boundaries and dislocations.

4. The silicon composition of claim 1, wherein the silicon composition is p-doped.

5. The silicon composition of claim 1, wherein the silicon composition is n-doped.

6. A process for producing a silicon composition with a total oxygen content of $8 \times 10^{17}$ atoms/cm$^3$ to $1 \times 10^{19}$ atoms/cm$^3$ and a dislocation density of $1 \times 10^5$ cm$^{-2}$ to $5 \times 10^7$ cm$^{-2}$; the process comprising substantially saturating with oxygen a molten silicon that is in contact with a member selected from the group consisting of silicon monoxide and silicon dioxide; wherein the dislocation density is set by means of the cooling rate of the silicon.

7. The process of claim 6, wherein the step of substantially saturating the molten silicon with oxygen comprises the step of treating the molten silicon with an oxygen-containing gas before or during crystallization of silicon.

8. A process for producing a silicon composition with a total oxygen content of $8 \times 10^{17}$ atoms/cm$^3$ to $1 \times 10^{19}$ atoms/cm$^3$, a dislocation density of $1 \times 10^5$ cm$^{-2}$ to $5 \times 10^7$ cm$^{-2}$, and at least 25% of the oxygen present in the form of silicon/oxygen precipitations which are concentrated in the area of grain boundaries and dislocations; the process comprising substantially saturating with oxygen a molten silicon that is in contact with a member selected from the group consisting of silicon monoxide and silicon dioxide; wherein the dislocation density is set by means of the cooling rate of the silicon, and wherein the proportion of the total oxygen content made up of silicon/oxygen precipitations and the concentration thereof in the area of grain boundaries and dislocations is achieved by heat treatment of the silicon.

9. The process of claim 8, wherein the step of substantially saturating the molten silicon comprises the step of treating the molten silicon with an oxygen-containing gas before or during crystallization of silicon.

10. The process of claim 8, wherein the silicon is heated at a temperature of 500° C. to 1250° C. for a period of one minute to ten hours, wherein the temperature, within the indicated range, is kept constant or varied, and wherein the temperature exceeds 950° C. for at least one minute.

11. The process of claim 8, wherein the silicon is heated at a temperature of 800° C. to 1150° C. for a period of one minute to ten hours, wherein the temperature, within the indicated range, is kept constant or varied, and wherein the temperature exceeds 950° C. for at least one minute.

12. The process of claim 8, wherein the silicon is produced using a film-drawing or a film-casting process.

13. The process of claim 8, wherein the silicon composition is produced using a Ribbon Growth on Substrate process.

14. The silicon composition of claim 1, wherein the composition is a solar cell.

15. The composition of claim 1, wherein the silicon composition is a p-doped n$^+$p-solar cell.

16. The composition of claim 1, wherein the composition is a n-doped p$^+$n-solar cell.

* * * * *

UNITED STATES PATENT AND TRADEMARK OFFICE
CERTIFICATE OF CORRECTION

PATENT NO.    : 6,294,726 B1
DATED         : September 25, 2001
INVENTOR(S)   : Christian Hässler, Hans-Ulrich Höfs, Wolfgang Koch, Siegfried Thurm, and Otwin Breitenstein It is certified that error appears in the above-identified patent and that said Letters Patent is hereby corrected as shown below:

Column 4,
Line 57, delete "µm" and insert -- nm --.

Column 6,
Line 67, delete "ant-" and insert -- anti- --.

Column 7,
Line 42, delete "5x10" and insert -- $5 \times 10^7$ --.

Signed and Sealed this

Twenty-sixth Day of March, 2002

*Attest:*

*Attesting Officer*

JAMES E. ROGAN
*Director of the United States Patent and Trademark Office*